(12) United States Patent
Xia (10) Patent No.: US 11,825,750 B2
(45) Date of Patent: Nov. 21, 2023

(54) MICRO-ELECTROMECHANICAL SYSTEM DEVICE AND METHOD OF FORMING THE SAME

(71) Applicant: Vanguard International Semiconductor Corporation, Hsinchu (TW)

(72) Inventor: Jia Jie Xia, Singapore (SG)

(73) Assignee: Vanguard International Semiconductor Corporation, Hsinchu (TW)

(*) Notice: Subject to any disclaimer, the term of this patent is extended or adjusted under 35 U.S.C. 154(b) by 299 days.

(21) Appl. No.: 17/083,337

(22) Filed: Oct. 29, 2020

(65) Prior Publication Data

US 2022/0140225 A1    May 5, 2022

(51) Int. Cl.
| | |
|---|---|
| *B81B 3/00* | (2006.01) |
| *H10N 30/30* | (2023.01) |
| *H10N 30/05* | (2023.01) |
| *H10N 30/50* | (2023.01) |
| *G01P 15/09* | (2006.01) |

(52) U.S. Cl.
CPC ......... *H10N 30/306* (2023.02); *B81B 3/0021* (2013.01); *B81B 3/0067* (2013.01); *G01P 15/09* (2013.01); *H10N 30/05* (2023.02); *H10N 30/50* (2023.02); *B81B 2201/0235* (2013.01)

(58) Field of Classification Search
CPC ...... H10N 30/306; H10N 30/05; H10N 30/50; B81B 3/0021; B81B 3/0067; B81B 2201/0235; B81C 1/0015; B81C 2203/0109
See application file for complete search history.

(56) References Cited

U.S. PATENT DOCUMENTS

| | | | |
|---|---|---|---|
| 5,485,749 A | 1/1996 | Nohara et al. | |
| 7,318,349 B2 | 1/2008 | Vaganov et al. | |
| 9,550,668 B1 | 1/2017 | Xia | |
| 2006/0101912 A1* | 5/2006 | Wu | B60C 23/0408 73/514.34 |
| 2015/0357375 A1* | 12/2015 | Tsai | H01L 41/1132 257/416 |

FOREIGN PATENT DOCUMENTS

| | | |
|---|---|---|
| TW | 201738169 A | 11/2017 |
| TW | 201803162 A | 1/2018 |

\* cited by examiner

*Primary Examiner* — Moazzam Hossain
(74) *Attorney, Agent, or Firm* — Winston Hsu (57) ABSTRACT

A micro-electromechanical system (MEMS) device and a method of forming the same, the MEMS device includes a composite substrate, a cavity, a piezoelectric stacking structure and a proof mass. The composite substrate includes a first semiconductor layer, a bonding layer and a second semiconductor layer from bottom to top. The cavity is disposed in the composite substrate, and the cavity is extended from the second semiconductor layer into the first semiconductor layer and not penetrated the first semiconductor layer. The piezoelectric stacking structure is disposed on the composite substrate, with the piezoelectric stacking structure having a suspended region over the cavity. The proof mass is disposed in the cavity to connect to the piezoelectric stacking structure.

8 Claims, 12 Drawing Sheets

MICRO-ELECTROMECHANICAL SYSTEM DEVICE AND METHOD OF FORMING THE SAME

BACKGROUND OF THE INVENTION

1. Field of the Invention

The present disclosure relates to a micro-electromechanical system (MEMS) device and a method of forming the same, and more particularly, to a MEMS device for acoustic application and a method of forming the same.

2. Description of the Prior Art

A micro-electromechanical system (MEMS) device is a microscopic device that is fabricated through general semiconductor processes, such as depositing or selective etching material layers. The microscopic devices include both the electronic and mechanical function which is operated based on, for instance, electromagnetic, electrostrictive, thermoelectric, piezoelectric, or piezoresistive effects. Therefore, MEMS structures are often applied to microelectronics such as accelerometer, gyroscope, mirror, and acoustic sensor, etc.

Recently, MEMS accelerometer products bring a new dimension to acoustic transducers, due to the fast development of true wireless stereo (TWS) earphone, and which is used for sensing the vibration of voices. The MEMS accelerometer products deployed in TWS earphones allows the TWS earphones to attractively pick-up voice even when there is high noise or wind noise in the surrounding environment. However, currently design of MEMS accelerometer product is mainly thick and large, so as to be applied on mobile phone generally, which could not meet the minimized requirement of the TWS earphones. Thus, a new accelerometer design is needed for acoustic application.

SUMMARY OF THE INVENTION

The present disclosure provides a micro-electromechanical system (MEMS) device and a method of forming the same, in which the MEMS device includes a minimized proof mass occupying a relative smaller area as in comparison with the coverage area of the suspended structure such as a cantilever, a diaphragm or the like. Through this way, the MEMS device of the present disclosure enables to be applied on TWS earphones, for supplying the voice vibration of microphones.

An embodiment of the present disclosure provides a MEMS device including a composite substrate, a cavity, a piezoelectric stacking structure and a proof mass. The composite substrate includes a first semiconductor layer, a bonding layer and a second semiconductor layer from bottom to top. The cavity is disposed in the composite substrate, and the cavity is extended from the second semiconductor layer into the first semiconductor layer and not penetrated the first semiconductor layer. The piezoelectric stacking structure is disposed on the composite substrate, with the piezoelectric stacking structure having a suspended region over the cavity. The proof mass is disposed in the cavity to connect to the piezoelectric stacking structure.

An embodiment of the present disclosure provides a method of forming MEMS device including the following steps. Firstly, a composite substrate is provided and a cavity is formed in the composite substrate. Next, a piezoelectric stacking structure is formed on the composite substrate with the piezoelectric stacking structure including a suspended region over the cavity. Then, a proof mass is formed in the cavity to connect to the piezoelectric stacking structure, wherein a coverage area of the proof mass is less than ½ of a coverage area of the suspended region.

These and other objectives of the present invention will no doubt become obvious to those of ordinary skill in the art after reading the following detailed description of the preferred embodiment that is illustrated in the various figures and drawings.

DETAILED DESCRIPTION

For better understanding of the presented disclosure, preferred embodiments will be described in detail. The preferred embodiments of the present disclosure are illustrated in the accompanying drawings with numbered elements.

In the present disclosure, the formation of a first feature over or on a second feature in the description may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, spatially relative terms, such as "beneath," "below," "lower," "over," "above," "upper" and the like, may be used herein for ease of description to describe one element or feature's relationship to another element (s) or feature (s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, preferably within 10%, and more preferably within 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Figure 1:
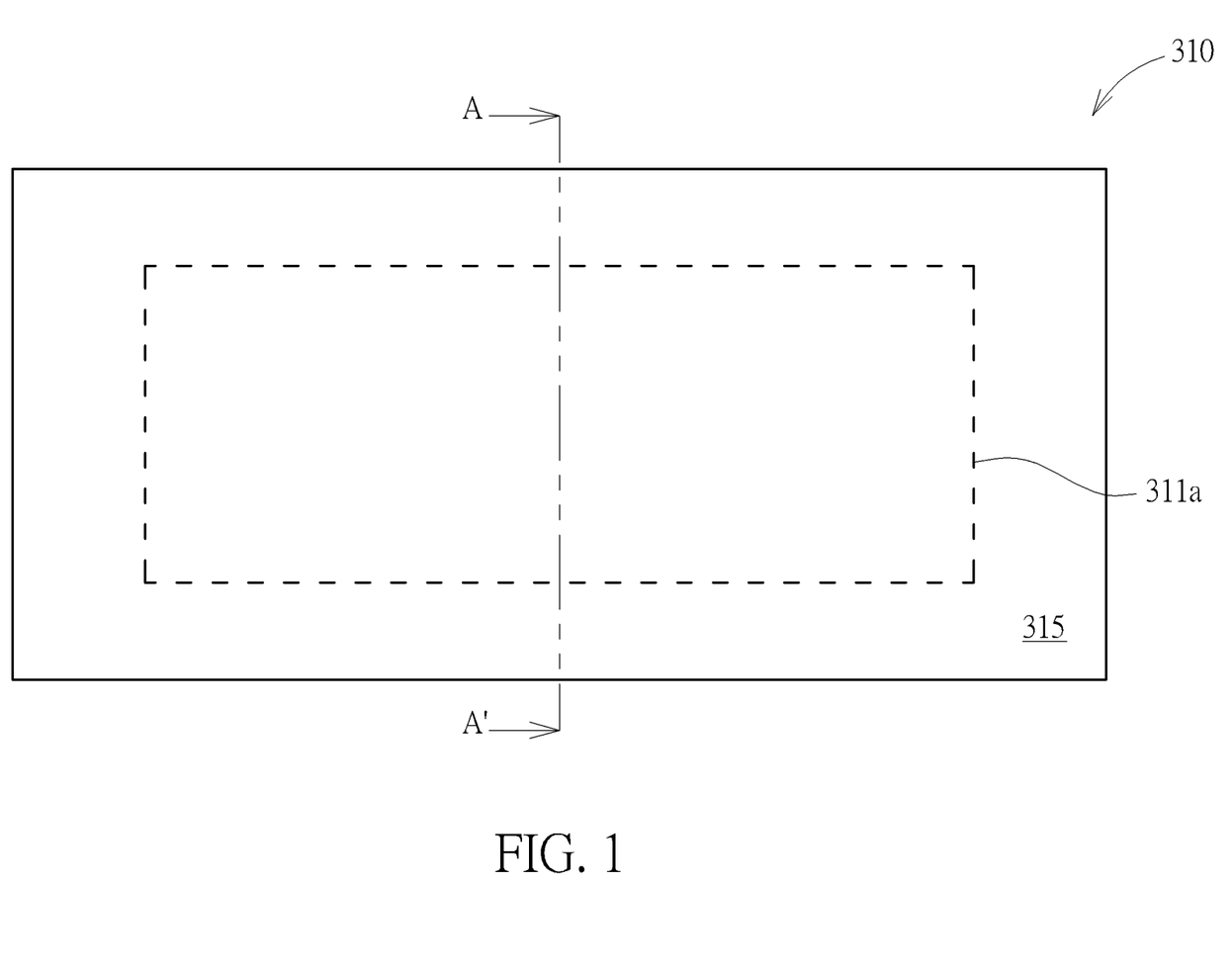
FIG. 1 is a schematic diagram illustrating a tow view of a MEMS device after forming cavity.
Figure 2:
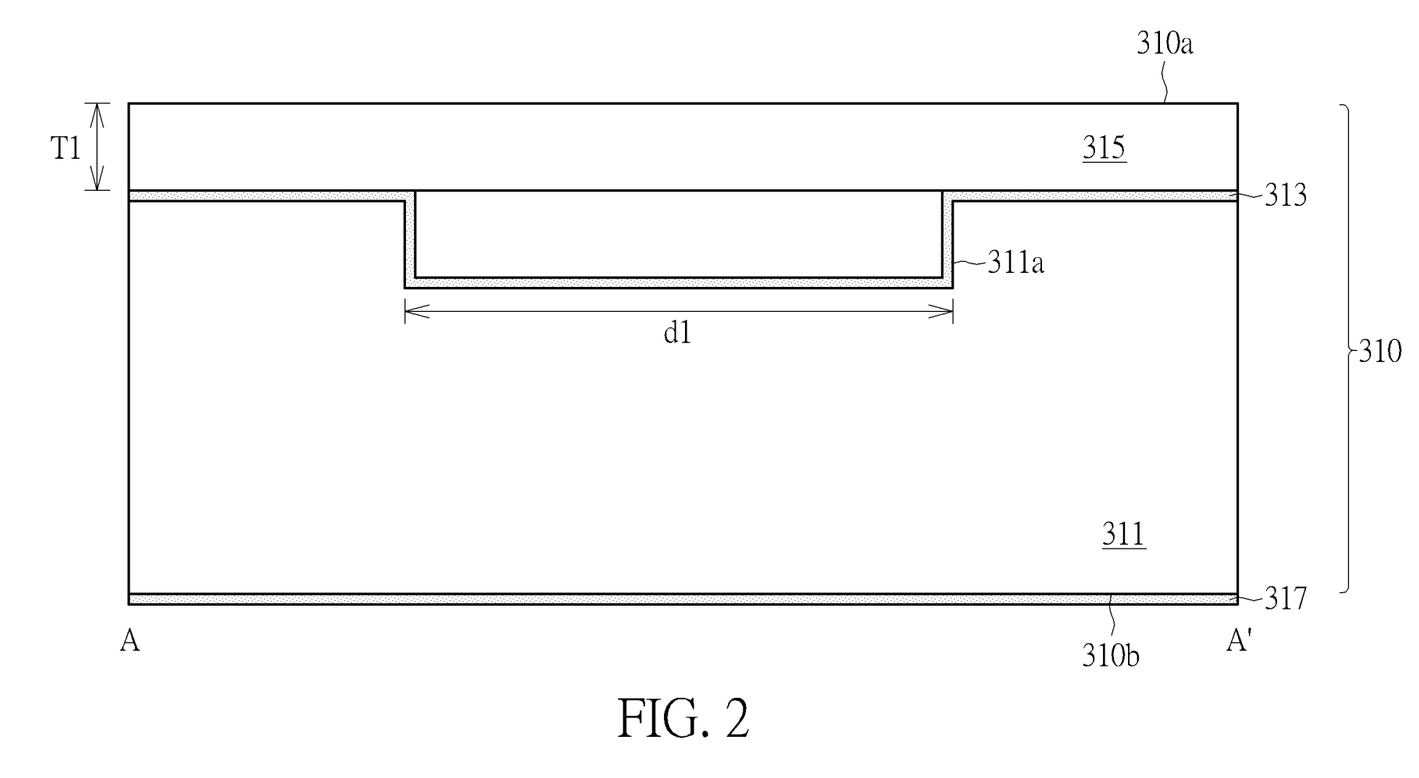
FIG. 2 is a schematic diagram illustrating a cross-sectional view taken alone a cross line A-A' in FIG. 1.

Please refer to FIGS. 1-10, which illustrate a fabricating process of a MEMS device 300 according to a first embodiment of the present disclosure, with FIGS. 1, 4, 6 and 9 respectively showing a top view of a MEMS device during the fabrication, with other figures respectively showing a cross-sectional view of a MEMS device during the fabrication. Firstly, as shown in FIGS. 1-2, a composite substrate 310 such as a silicon-on-insulator (SOI) substrate is firstly provided for fabricating the MEMS device 300. The composite substrate 310 further includes a first semiconductor layer 311, with a material thereof being single-crystalline silicon, polysilicon, amorphous silicon or other suitable material for example, a bonding layer 313, with a material thereof being silicon oxide (SiO), silicon oxynitride (SiON) or silicon dioxide (SiO$_2$) for example, and a second semiconductor layer 315, with a material thereof being single-crystalline silicon, polysilicon, amorphous silicon or other suitable material for example, and the first semiconductor layer 311, the bonding layer 313 and the second semiconductor layer 315 are sequentially stacked from bottom to top. In the present embodiment, a thickness T1 of the second semiconductor layer 315 is preferably smaller than a thickness (not shown in the drawings) of the first semiconductor layer 311, for example, the thickness of the first semiconductor layer 311 may be about 400-500 micrometers (μm), and the thickness T1 of the second semiconductor layer 315 may be about 50-100 μm, but not limited thereto. Preferably, the thickness T1 of the second semiconductor layer 315 is equal to a predetermined thickness of a proof mass formed subsequently, for example 50 μm, but not limited thereto. One of ordinary skill in the art would fully understand that, the thickness of the semiconductor layer 315 may also be further adjustable according to the required sensing accuracy of practical products, by reference to the formula (I) below.

$$a_{min} = \frac{\sqrt{4\kappa_B T \omega_0}}{m_i Q} \quad (I)$$

wherein $a_{min}$ being minimum detectable signal; $K_B$ being Boltzmann's constant; T being absolute temperature; $\omega_0$ being resonance frequency; $m_i$ being sensor mass; and Q being quality factor.

In one embodiment, a primary cavity 311a is previously formed in the composite substrate 310, for example being extended from the top surface of the first semiconductor layer 311 into the first semiconductor layer 311 as shown in FIG. 2, and the bonding layer 313 covers the top surface of the first semiconductor layer 311 and the inner surface of the primary cavity 311a. In one embodiment, the fabrication of the composite substrate 310 is for example carried by firstly providing two semiconductor layers (not shown in the drawings) being about 400-500 μm in thickness, forming the primary cavity 311a in one of the two semiconductor layers, oxidizing a surface of the one of the two semiconductor layers to form the bonding layer 313, and fusion bonding the two semiconductor layers through the bonding layer 313. Then, another one of the two semiconductor layers is thin down to a certain thickness such as the thickness T1, to obtain the composite substrate 310. In another embodiment, the bonding layer 313 may also be formed by directly disposing the bonding layer 313 on the semiconductor layer and the primary cavity 311a, and the bonding layer 313 may include an organic materials, for example polyimide, photo resist or other suitable materials.

Precisely speaking, the composite substrate 310 has two surfaces opposite to each other, such as a first surface 310a and a second surface 310b as shown in FIG. 2, wherein the primary cavity 311a is formed adjacent to the first surface 310a, namely the front side of the composite substrate 310, to obtain a dimension d1 for example being about 100-150 μm, but not limited thereto. Namely, the primary cavity 311a is used to primary define the position and size of a cavity formed subsequently, so that, the dimension d1 of the primary cavity 311a may be further adjustable according to a predetermined dimension of the cavity formed in the subsequent processes. On the other hand, an insulating layer 317 is sequentially formed on the second surface 310b, namely the back side of the composite substrate 310. The insulating layer 317 for example includes silicon oxide or silicon dioxide, but not limited thereto. In one embodiment, the insulating layer 317 may be formed through an oxidization process, such as the same oxidation process while forming the bounding layer 313, but not limited thereto.

Figure 3:
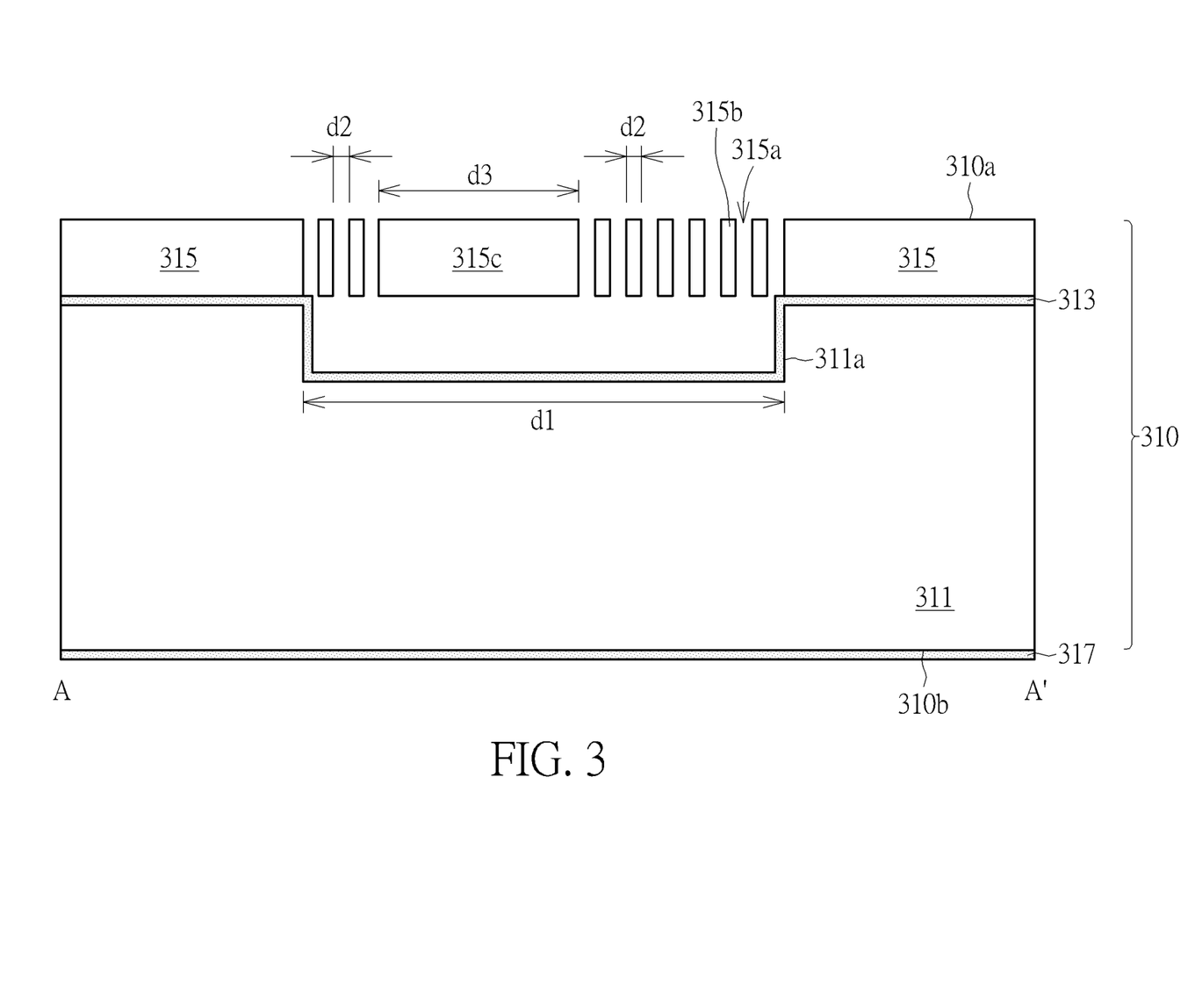
FIG. 3 is a schematic diagram illustrating a cross-sectional view of a MEMS device after forming trenches.

Next, as shown in FIG. 3, a plurality of trenches 315a is formed in the composite substrate 310, with each of the trenches 315a throughout two opposite surfaces of the second semiconductor layer 315. The trenches 315a are separately disposed at the position corresponding to the primary cavity 311a underneath, to define at least one proof mass region 315c within the area of the primary cavity 311a, as shown in FIG. 3. Preferably, the proof mass region 315c has a dimension d3 which is substantially equal to a predetermined dimension of the proof mass formed subsequently, and the predetermined dimension of the proof mass may be determined by a required sensing accuracy of practical products, as reference to the formula (I) above. It is noted that, each of the trenches 315a is spaced apart from each other by the same spacing 315b, and a dimension d2 of each of the trenches 315a is preferably decided by a required oxidation rate of the spacing 315b in the subsequent oxidation process. In one embodiment, each of the trenches 315a and each of the spacing 315b may include the same dimension d2, such as being about 0.5-2.5 μm, preferably being about 0.6-0.8 μm, but not limited thereto. In another embodiment, the dimensions of the trenches 315a and the spacing 315b may also be different from each other, or trenches with various dimensions or spacing with various dimensions may also be formed, so as to achieve different oxidation rate in practical fabrication process.

Figure 4:
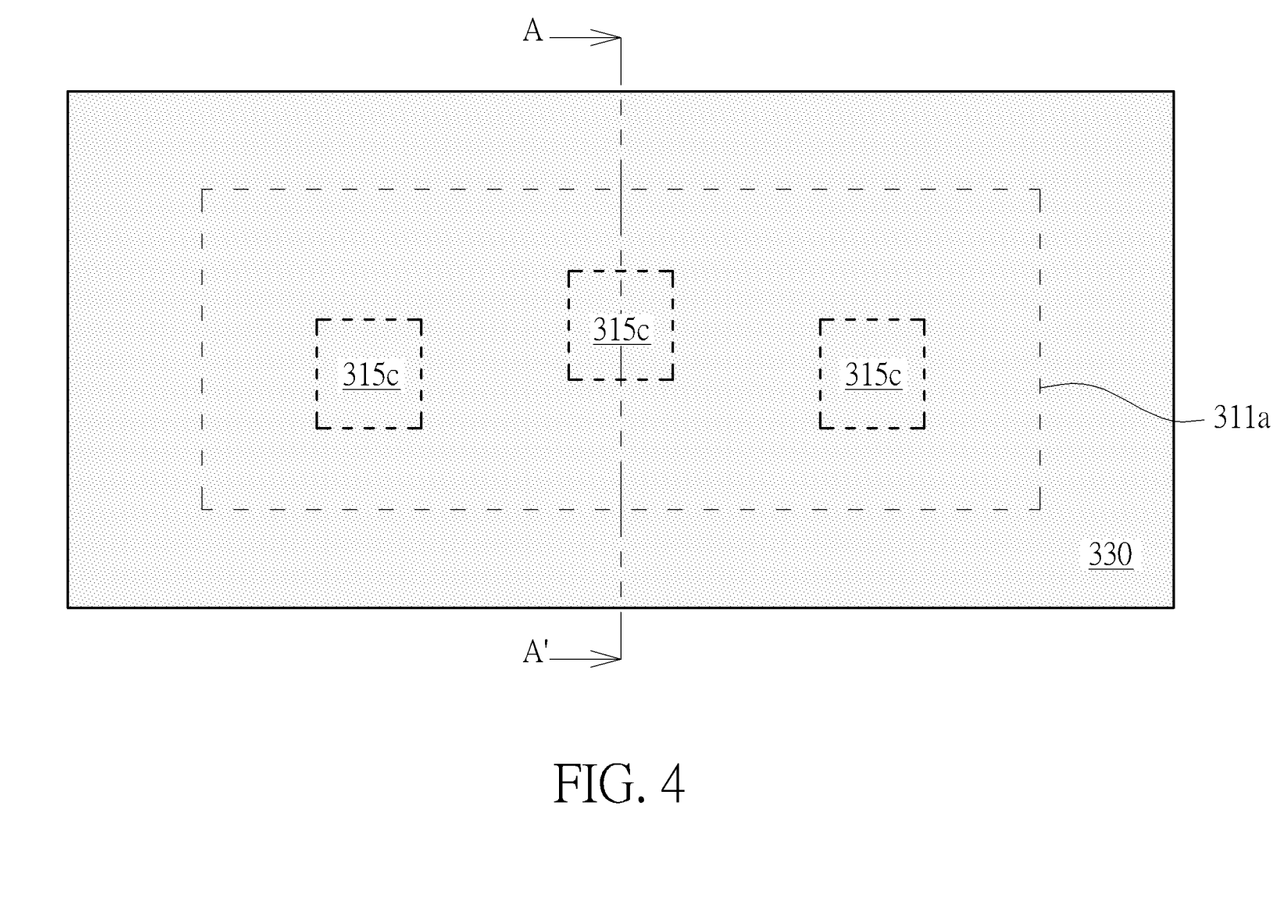
FIG. 4 is a schematic diagram illustrating a top view of a MEMS device after an oxidation process.
Figure 5:
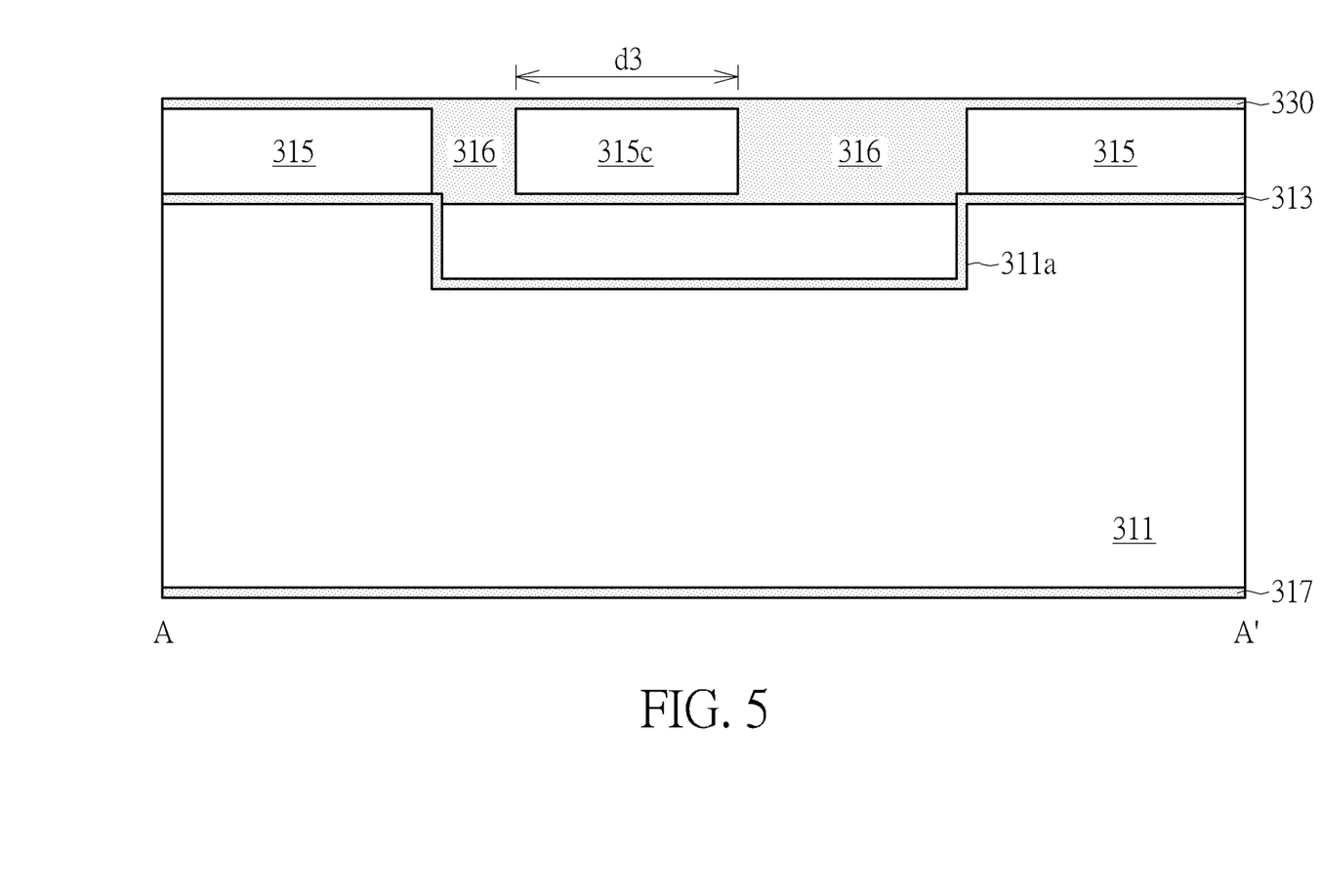
FIG. 5 is a schematic diagram illustrating a cross-sectional view of a MEMS device taken alone a cross line A-A' in FIG. 4.

Following the processes above, referring to FIGS. 4-5, an oxidation process is performed either through a wet oxidation process or a dry oxidation process, to form oxidation regions 316 in the second semiconductor layer 315. In one embodiment, the oxidation regions 316 preferably includes the same material as the bonding layer 313, or a material having the same etching selectivity related to that of the bonding layer 313, but not limited thereto. Precisely speaking, the oxidation regions 316 are formed by oxidizing the material of the spacing 315b, so that, the oxidized spacing 315b may have an increased volume compared to the volume of the original spacing 315b, thereby filling up the trenches 315a adjacent thereto and merging all of the oxidized spacing 315b to become the oxidation regions 316. In one embodiment, the second semiconductor layer 315 for example includes silicon, so that, and the volume of the oxidized spacing 315b (for example including silicon oxide or silicon dioxide) may be about two times increased to fill up the trenches 315a and to merge with each other, but not limited thereto. It is also known that, since the oxidation is uniformly performed on all exposed surfaces of the second semiconductor layer 315, a bottom surface of the proof mass region 315c is also oxidized as shown in FIG. 5, and an insulating layer 330 is further formed on the top surface of the second semiconductor layer 315 (namely the first surface 310a of the composite substrate 310). Accordingly, the proof mass region 315c is therefore surrounded by these oxidized portions such as the oxidation regions 316 and the insulating layer 330. It is noteworthy that, in one embodiment, one or more than one proof mass region may be optionally defined in accordance with the position of the primary cavity 311a. As an example, three proof mass regions 315c are simultaneously defined within the same primary cavity 311a as shown in FIG. 4, but not limited thereto. People skilled in the art should fully understand that any number of the proof mass regions may also be formed within the primary cavity 311a due to various product requirements.

Figure 6:
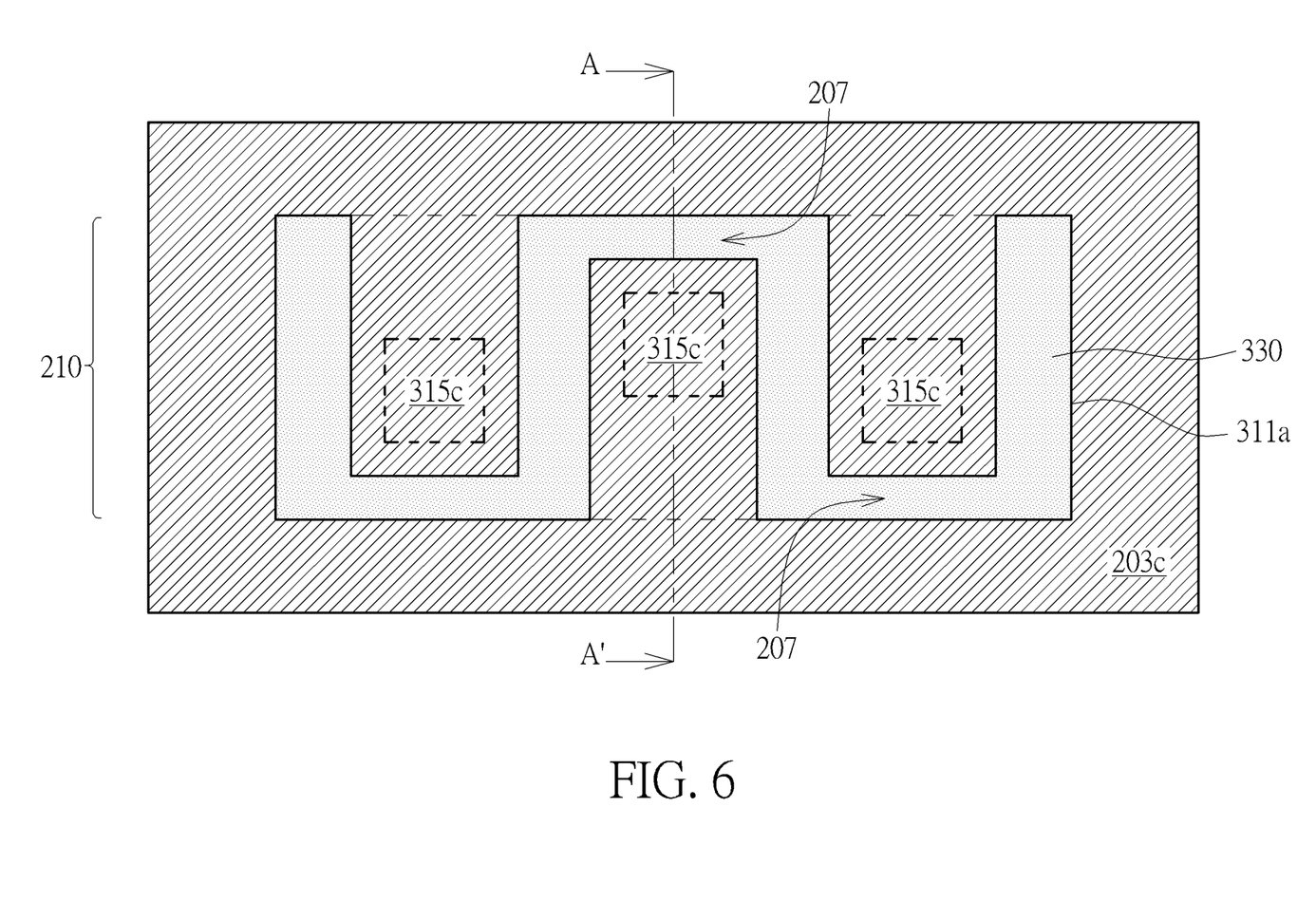
FIG. 6 is a schematic diagram illustrating a top view of a MEMS device after forming a piezoelectric stacking structure.
Figure 7:
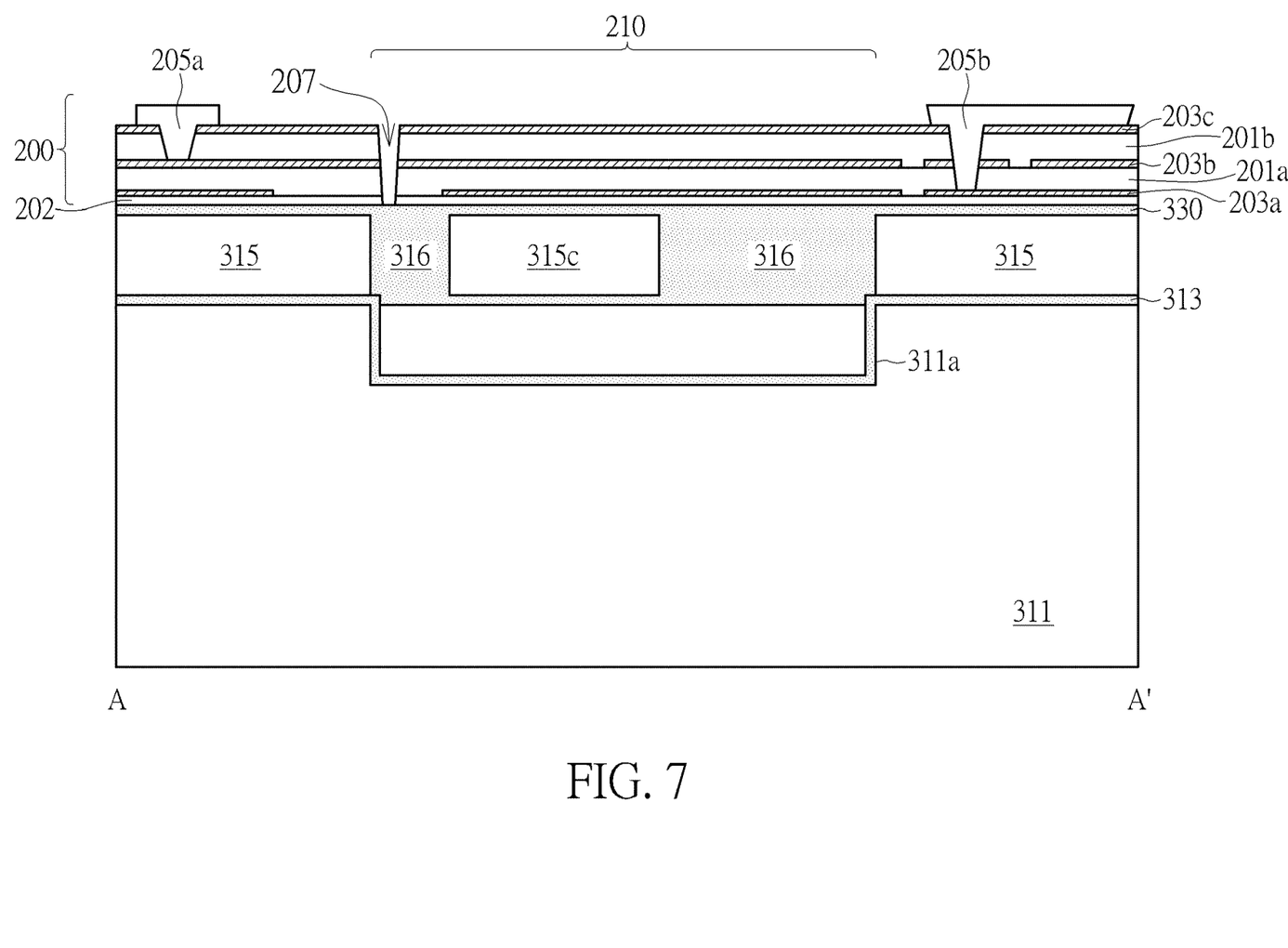
FIG. 7 is a schematic diagram illustrating a cross-sectional view of a MEMS device taken alone a cross line A-A' in FIG. 6.

Then, as shown in FIGS. 6-7, a piezoelectric stacking structure 200 is further formed on the insulating layer 330, with the piezoelectric stacking structure 200 being disposed on the front side of the composite substrate 310. Precisely, the piezoelectric stacking structure 200 may be any suitable semiconductor device being formed through general semiconductor processes such as depositing and/or selectivity etching material layers. In one embodiment, the piezoelectric stacking structure 200 includes at least one piezoelectric layer, such as two piezoelectric layers 201a, 201b, and at least one metal layer, such as three metal layers 203a, 203b, 203c are alternately stacked on an insulating layer 202 over the insulating layer 330, wherein the piezoelectric layer for example includes a piezoelectric material like aluminum nitride (AlN), doped AlN, scandium aluminium nitride (ScAlN), scandium doped aluminum nitride (AlScN), lead zirconate titanate (PZT), zinc oxide (ZnO), polyvinylidene fluoride (PVDF), lead magnesium niobate-lead titanate (PMN-PT), $LiNbO_3$, or $LiTaO_3$, and the metal layer for example includes a metal material like copper (Cu), molybdenum (Mo), tungsten (W), titanium (Ti), platinum (Pt) or aluminum, but not limited thereto. Precisely, a first piezoelectric layer 201a is stacked on a first metal layer 203a over the insulating layer 202, and a second piezoelectric layer 201b is stacked on a second metal layer 203b over the first piezoelectric layer 201a, and a third metal layer 203c is then stacked on the second piezoelectric layer 201b, as shown in FIG. 7, but not limited thereto. In another embodiment, one piezoelectric layer alternately stacked with two metal layers may also be formed. Furthermore, the piezoelectric stacking structure 200 further includes at least one conductive pad, such as two conductive pads 205a, 205b penetrated the piezoelectric stacking structure 200 to electrically connect different metal layers, such as the second metal layer 203b and the first metal layer 203a, respectively, and the conductive pad may include a conductive material like copper or aluminum. In order to clearly illustrate the disposing positions between the piezoelectric stacking structure 200 and the elements (for example the proof mass region 315c) disposed underneath, the detailed elements such as the conductive pad 205a, 205b of the piezoelectric stacking structure 200 may be omitted in FIG. 6.

It is noted that, the piezoelectric stacking structure 200 further includes at least one suspended region 210 corresponding to the position of the primary cavity 311a underneath, and at least one penetrating hole 207 is formed in the piezoelectric stacking structure 200 adjacent to the suspended region 210 as shown in FIG. 7, so that, a structure disposed within the suspended region 210 may be partially disconnected with the composite substrate 310 in a subsequent process to form a suspended structure like cantilever or diaphragm (not shown in the drawings). The suspended structure for example include a top electrode (such as the second metal layer 203b), a piezoelectric layer (such as the second piezoelectric layer 201a) and a bottom electrode (such as the first metal layer 203a) stacked from top to bottom in the piezoelectric stacking structure 200, and which is capable of vibrating at a certain frequency during the subsequent process. It is also known that, in one embodiment, one or more than one suspended regions 210 may be optionally formed in the piezoelectric stacking structure 200, over the primary cavity 311a. As an example, three suspended regions 210 are simultaneously formed with each of the three proof mass regions 315c being disposed underneath respectively, as shown in FIG. 6, for adjusting the vibrating frequency of each of the suspended structure to match the product requirements.

Figure 8:
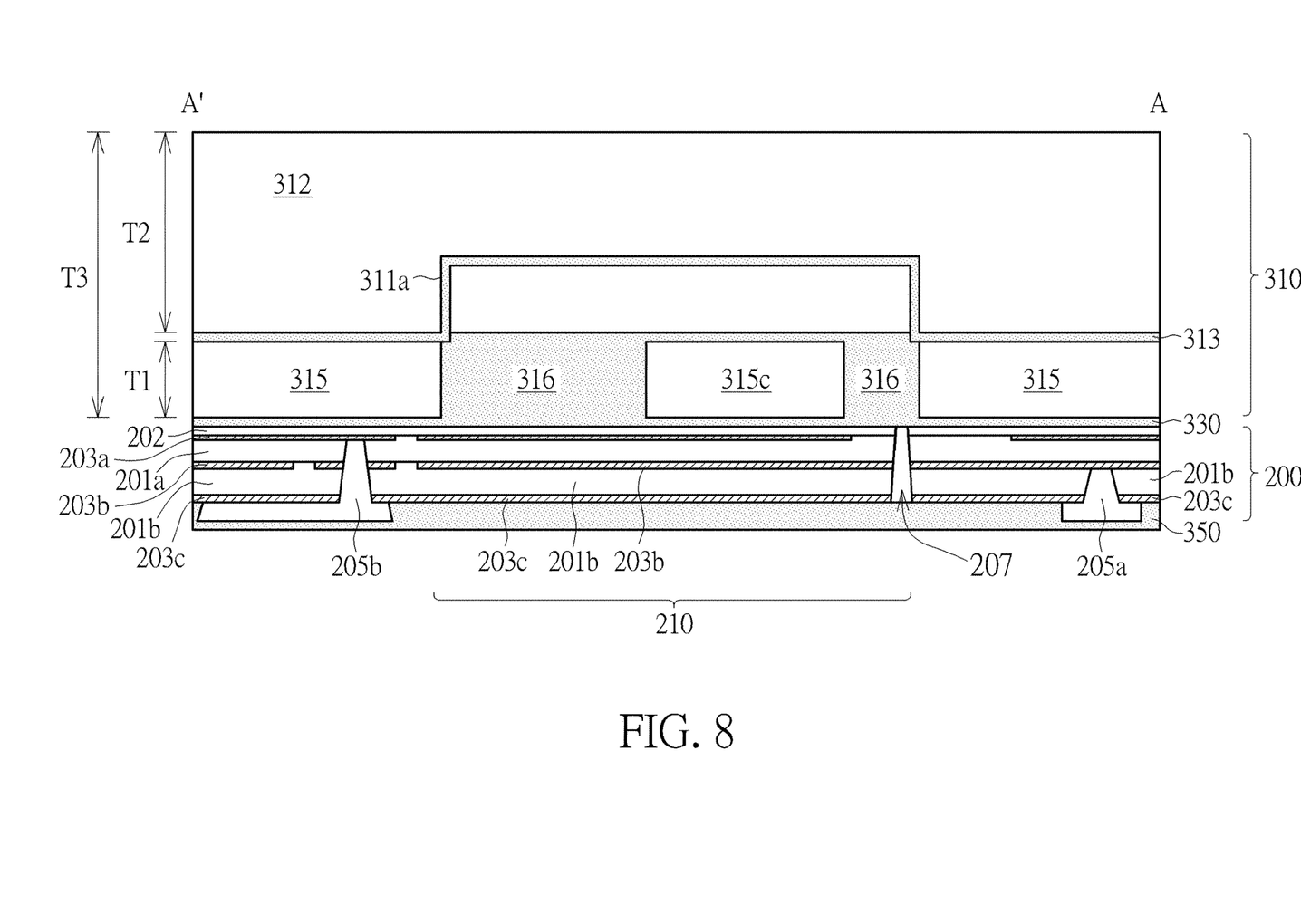
FIG. 8 is a schematic diagram illustrating a cross-sectional view of a MEMS device after thinning down a composite substrate.

Next, as shown in FIG. 8, a protection layer 350 is formed on the piezoelectric stacking structure 200 for protecting the elements disposed in the piezoelectric stacking structure 200, the protection layer 350 for example includes the same material as the bonding layer 313 and the insulating layer 330, or a material having the same etching selectivity related to that of the bonding layer 313 and the insulating layer 330, such as including silicon oxide or silicon dioxide but not limited thereto. Then, a thin down process is performed on the composite substrate 310 for example through the back side thereof, namely the side of the second surface 310b. Accordingly, the insulating layer 317 disposed on the second surface 310b is completely removed, and a portion of the first semiconductor layer 311 is removed to leave rest first semiconductor layer 312 having a reduce thickness T2. In one embodiment, the thickness T2 of the rest first semiconductor layer (also known as a thinned first semiconductor layer) 312 is for example about 200-300 μm, so that, a total thickness T3 of the composite substrate 310 may be about 300-400 μm, but not limited to.

Figure 9:
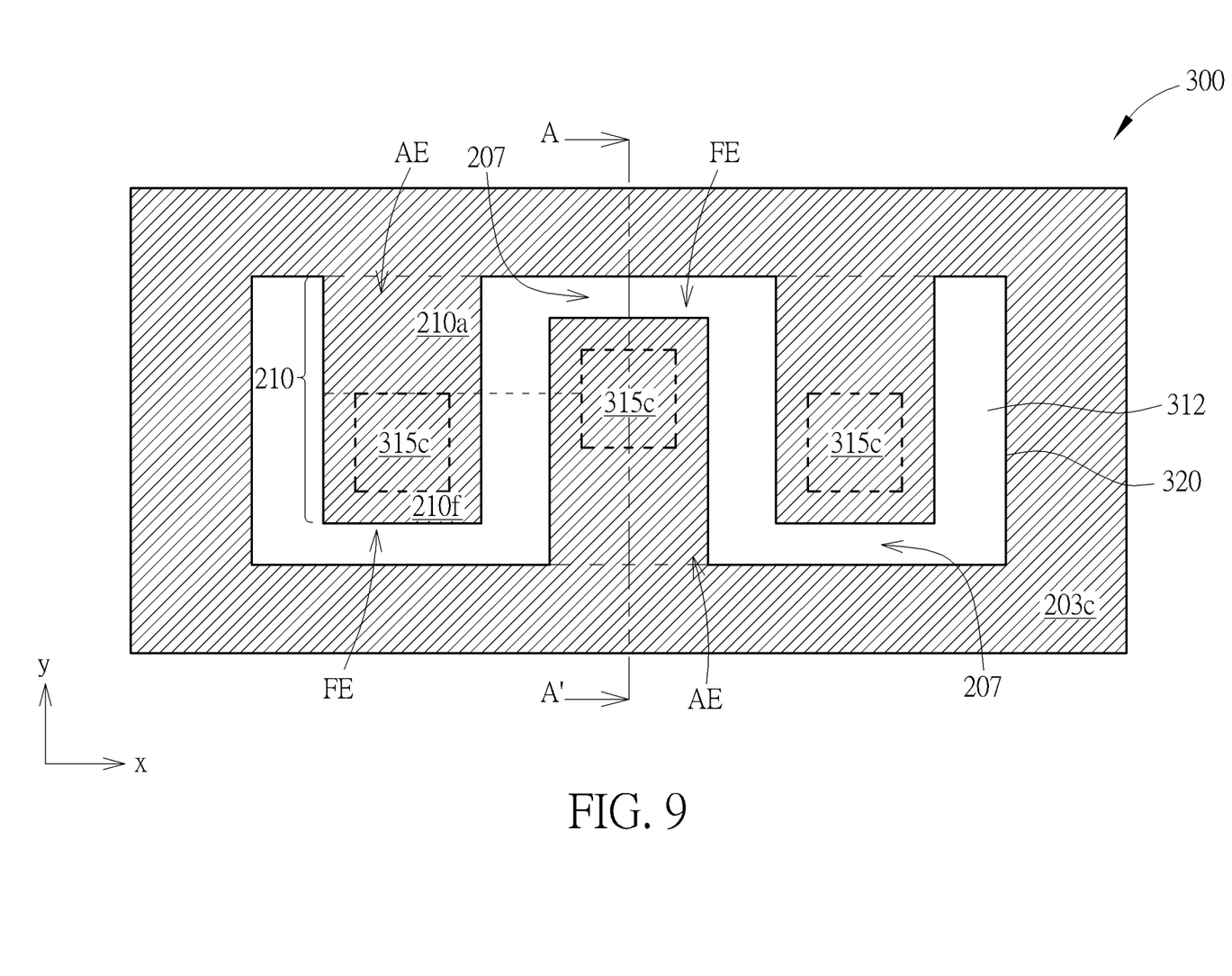
FIG. 9 is a schematic diagram illustrating a top view of a MEMS device after releasing the piezoelectric stacking structure.
Figure 10:
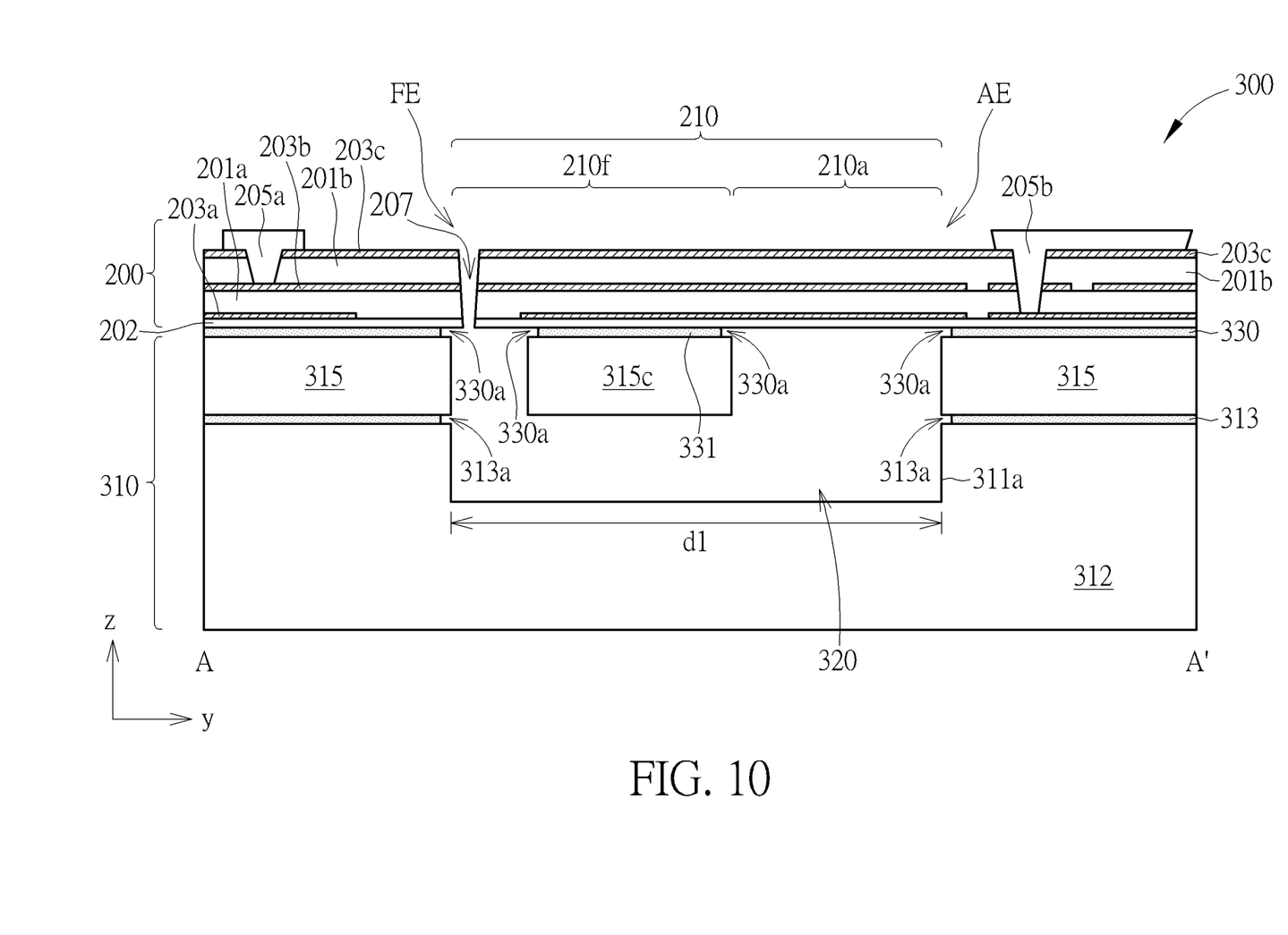
FIG. 10 is a schematic diagram illustrating a cross-sectional view of a MEMS device taken alone a cross line A-A' in FIG. 9.

After that, as shown in FIGS. 9-10, an etching process such as an isotropic wet etching process is performed from the front side of the composite substrate 310 to completely remove the protection layer 350 and the oxidation regions 316, and to partially remove the insulating layer 330 and the bonding layer 313 with similar materials or similar etching selectivity, thereby releasing the suspended regions 210 of the piezoelectric stacking structure 200 to form the MEMS device 300. As shown in FIG. 10, while removing the oxidation regions 316, some portions of the insulating layer 330 and the bonding layer 313 adjacent to oxidation regions 316 are also removed, so as to expose a portion of the bottom surface of the suspended regions 210 as shown in FIG. 10. In this way, the spaces generated by removing the oxidation regions 316 and the primary cavity 311a may together form a cavity 320 within the composite substrate 310, and the cavity 320 includes an opening with the uniform dimension d1, as shown in FIG. 10. The cavity 320 extends from the top surface of the second semiconductor layer 315 into the thinned first semiconductor layer 312, to connect with the exposed bottom surface of the suspended regions 210.

On the other hands, after removing the oxidation regions 316, the proof mass regions 315c of the second semiconductor layer 315 may therefore be disconnection with the remained portions of the second semiconductor layer 315. Then, the proof mass regions 315c may only connect to the bottom surfaces of the suspended regions 210 respectively, to configure as the proof masses of the MEMS device 300. Thus, the thickness of each of the proof masses may be substantially the same as the thickness T2 of the second semiconductor layer 315, for example being about 50-100 μm, preferably for 50 μm. As shown in FIG. 10, a portion of the insulating layer 331 is sandwiched between each of the suspended regions 210 and each of the proof masses (namely, the proof mass regions 315c). While performing the aforementioned etching process, sidewalls of the portion of the insulating layer 331 and other remained portions of the insulating layer 330 and the bonding layer 313 may be slightly removed, and some undercut portions 330a, 313a may be formed thereby adjacent to the cavity 320, as shown in FIG. 10.

Through the above processes, the MEMS device 300 is accomplished to include the piezoelectric stacking structure 200, the cavity 320 and at least one proof mass (namely the proof mass regions 315c of the second semiconductor layer 315) within the cavity 320. It is noted that, due to the formation of the penetrating hole 207, one end of each of the suspended regions 210 may be disconnected with the composite substrate 310 after removing the protection layer 350 and the oxidation regions 316, with the said end adjacent to the penetrating hole 207 becoming a free end "FE" of the suspended region 210. On the other hand, another end of the suspended region 210 is still connected with the composite substrate 310, to become an anchor end "AE" of the suspended region 210, as shown in FIGS. 9-10. In this way, each of the suspended regions 210 is therefore suspended over the composite substrate 310, and the suspended structure within each suspended region 210 is capable of vibrating when applying acoustic waves or electrical signals, with the proof mass further adjusting the suspended structure to have a resonant frequency that matches the required acoustic frequency range.

In addition, each of the proof mass has a reduced size in comparison with that of each suspended region 210, for example, the coverage area of each proof mass may be about 10% to 90% less, preferably about 25% to 50% less than the coverage area of each suspended region 210. In the present embodiment, each of the proof masses is preferably disposed at a half portion 210f of the suspended region 210 which is adjacent to the free end "FE" as shown in FIG. 9, for improving the sensor accuracy of the MEMS device 300 without causing impacting stiffness to the suspended structure. In a preferable embodiment, each of the proof mass may only partially overlaps with the half portion 210f of the suspended region 210 which is adjacent to the free end "FE", without overlapping with another portion 210a of the suspended region 210 which is adjacent to the anchor end "AE", as shown in FIG. 9, but not limited thereto. With such performance, the MEMS device 300 of the present embodiment may be configured as a MEMS piezoelectric accelerometer device, so as to be on TWS earphones, for supplying the voice vibration of microphones.

According to the aforementioned processes, the fabrication of the MEMS device 300 in the present embodiment is mainly characterized by forming trenches 315a in the composite substrate 310 and oxidizing the spacing 315b between the trenches 315a to form oxidation regions 316 and to simultaneously define the proof mass region 315c within the second semiconductor layer 315. Thus, the proof mass (namely the proof mass region 315c) and the cavity 320 of the MEMS device 300 may be conveniently and precisely formed by removing the oxidation regions 316 subsequently, so that, the cavity 320 may obtain the opening with uniform dimension d1 and the size of the proof mass and the position of the proof mass within the cavity 320 may also be precisely defined at the same time. People skilled in the arts should easily realize that although the trenches 315a or the oxidation regions 316 is formed after the SOI substrate is obtained, the practical fabrication process may have other variation or may be processes in another order. For example, in another embodiment (not shown in the drawings), a plurality of trenches such as the trenches 315a shown in FIG. 3 may be firstly formed in one of two semiconductors for forming the SOI substrate (not shown in the drawings), and then, oxidizing the spacing between the trenches either before or after bonding the two semiconductors for forming the SOI substrate. Following these, the one of the two semiconductors for forming the SOI substrate is then thin down, and a similar structure as shown in FIG. 5 may be still obtained thereby.

Figure 11:
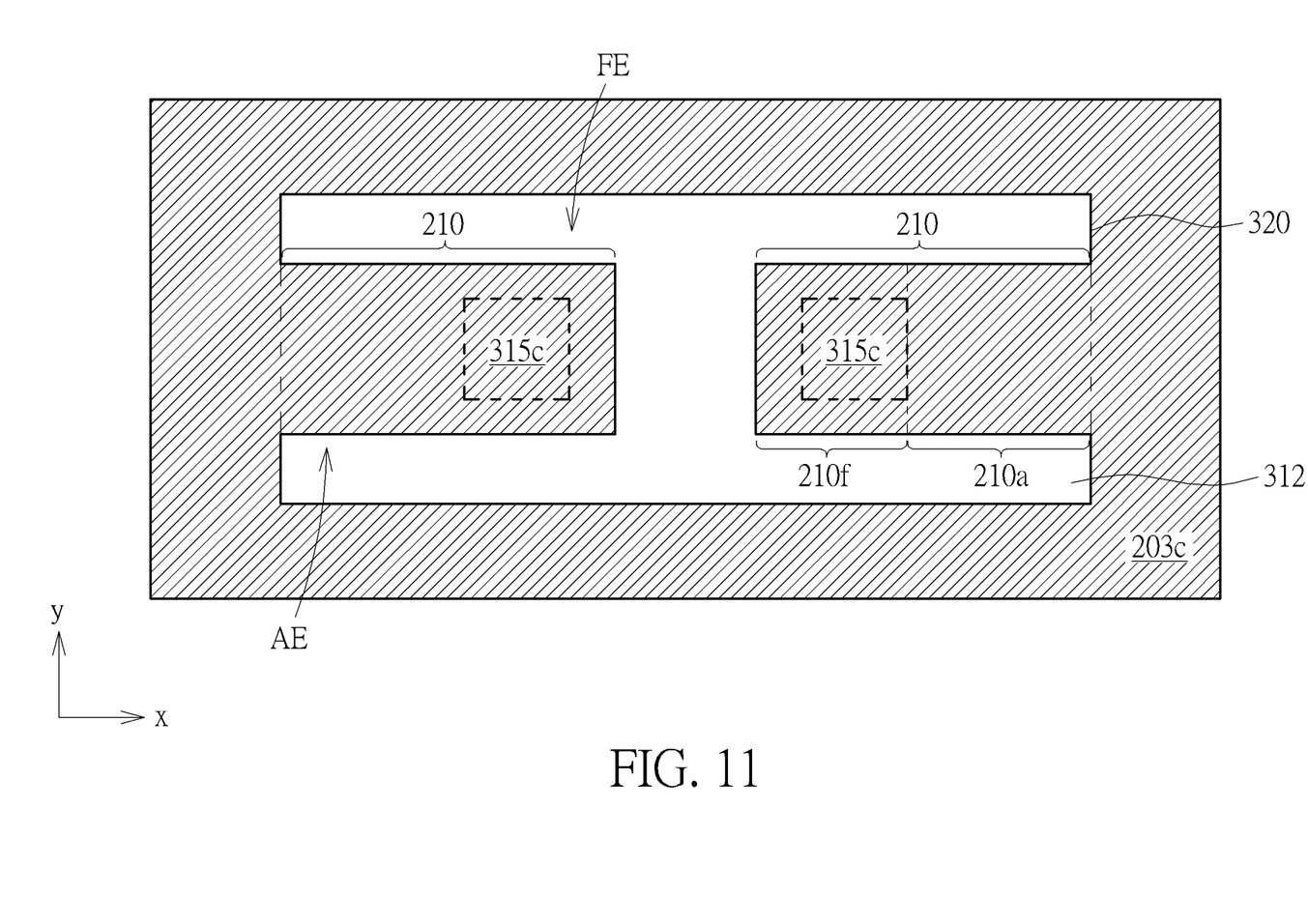
FIG. 11 is a schematic diagram illustrating a top view of a MEMS device according to another embodiment of the present disclosure.

Furthermore, although the aforementioned fabricating process of the MEMS device 300 is exemplified by forming three suspended regions 210 which are all extended along the same direction such as the y-direction as shown in FIG. 9, with each of the three suspended regions 210 being connected with three proof masses corresponding thereto respectively, the present disclosure is not limited thereto. In another embodiment, the number of the suspended regions 210 and the proof masses, as well as the arrangements thereof may be further adjustable according to required sensing accuracy of a MEMS device. For example, as shown in FIG. 11, less number of the suspended regions 210 and the proof masses may also be formed in the cavity 320 to obtain various detectable signals due to the aforementioned formula (I). Furthermore, the suspended regions 210 may also be formed along another direction such as the x-direction as shown in FIG. 11, for sensing signals from a different direction. In another embodiment, suspended regions extended along various directions respectively (not shown in the drawings) may further be formed for sensing signals from more different directions to meet practical product requirements.

The following description will further detail the different embodiments of the MEMS device and the fabricating processes thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 12:
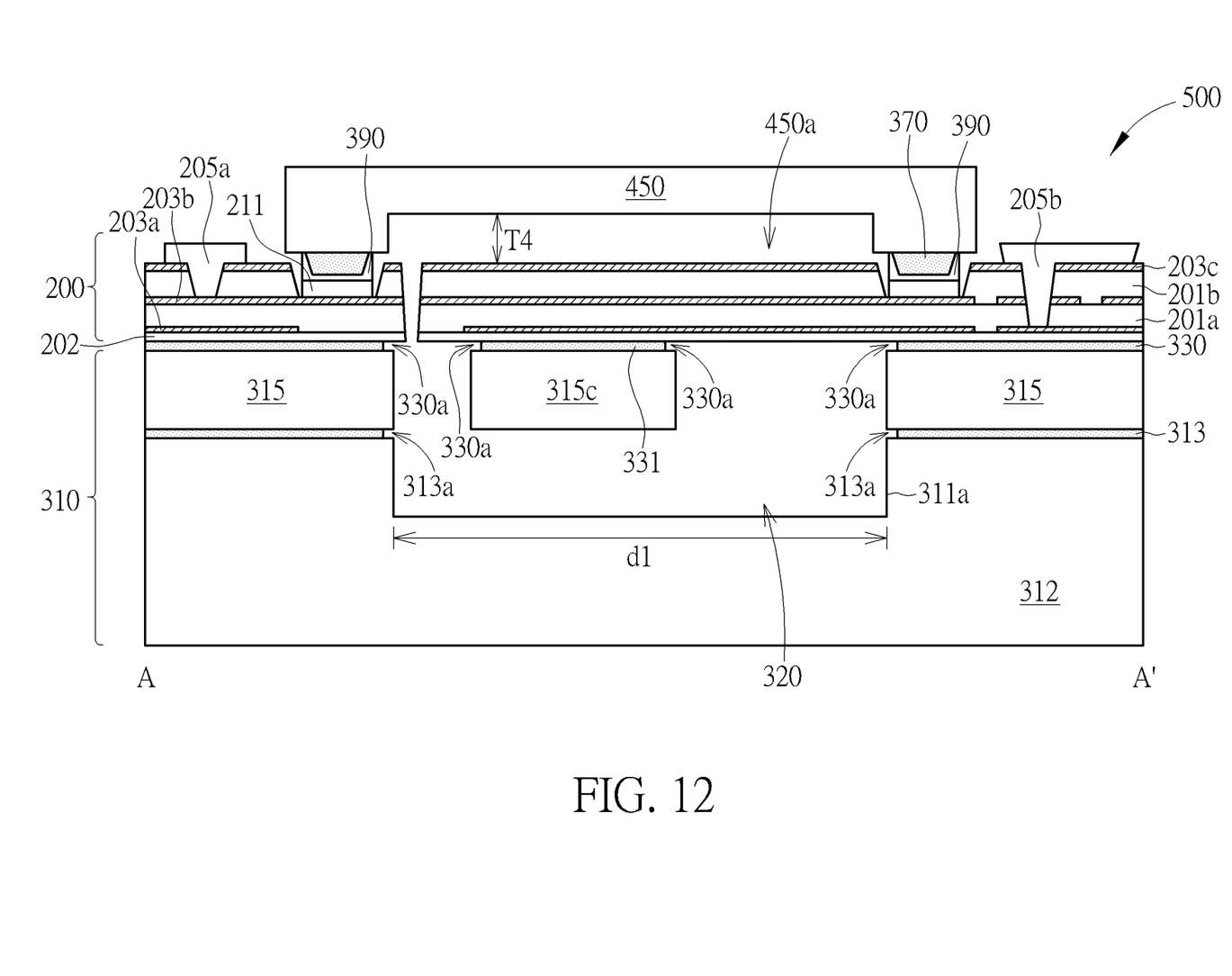
FIG. 12 is a schematic diagram illustrating a cross-sectional view of a MEMS device according to another embodiment of the present disclosure.

Please refer to FIG. 12, which illustrate a MEMS device 500 according to a second embodiment of the present disclosure. The formal structures of MEMS device 500 in the present embodiment are substantially similar to those in the aforementioned embodiment, and the similarity between the present embodiment and the aforementioned embodiment will not be redundantly described hereinafter. The difference between the present embodiment and the aforementioned embodiment is mainly in that an additional cover layer 450 may be formed on the piezoelectric stacking structure 200 to create a vacuum cavity within the MEMS device 500.

Precisely speaking, the cover layer 450 for example includes a rigid substrate material such as silicon or glass, and the cover layer 450 is attached to the front side of the composite substrate 310, so as to form a cavity 450*a* between the cover layer 450 and the piezoelectric stacking structure 200 disposed on the composite substrate 310. Preferably, the cavity 450*a* has a thickness T4 being about 5-20 μm, and which may perform a vacuum state for high-gravity application. It is noted that, the cover layer 450 is bounded to piezoelectric stacking structure 200 through attaching a protrusion structure thereof to a conductive pad 211 over the piezoelectric stacking structure 200. In one embodiment, the protrusion structure may be disposed around a periphery of the cover layer 450 to include a circular shape from a top view (not shown in the drawings), so that, two protrusion structures are shown in a cross-sectional view as shown in FIG. 12. The protrusion structure may include an oxide portion 370 and a coating layer 390 covering the oxide portion 370, with the oxide portion 370 including silicon oxide or silicon dioxide, and with the coating layer 390 including a metal material like aluminum germanium (AlGe), but not limited thereto. Preferably, a thickness of the oxide portion 370 is, for example, about 2-10 μm, such that, the cavity 450*a* with enough space may be therefore formed in the MEMS device 500.

Through the above processes, the MEMS device 500 is accomplished to include the piezoelectric stacking structure 200, the cavity 320, the proof mass (namely the proof mass regions 315*c* of the second semiconductor layer 315), and the cover layer 450. Accordingly, an additional vacuum cavity 450*a* is further formed between the cover layer 450 and the piezoelectric stacking structure 200, so that the MEMS device 500 is allowable to be used under a high impact state as a high-gravity accelerometer, for example being about 10 g-300 g, for achieving better sensing activity.

In summary, one of the objectives of the present disclosure provides a MEMS device having a proof mass in a reduced and accurate size, with the proof mass occupying a related less area in comparison with the coverage area of the suspended region where the proof mass is connected thereto, for example being about 10% to 90% less, and preferably about 25% to 50% less, but not limited thereto. In addition, one or more than one suspended regions in correspondence with one or more than one proof masses may be optionally formed in the MEMS device, with each proof mass connecting with each suspended region respectively, to achieve additionally coordination on vibrating frequency. In this way, the MEMS device of the present disclosure may be configured as a MEMS piezoelectric accelerometer device, so as to be on TWS earphones, for supplying the voice vibration of microphones.

Also, one of the objectives of the present disclosure provides a fabrication method of the MEMS device by firstly forming some trenches in a composite substrate and oxidizing the spacing between the trenches to define a proof mass by the oxidized spacing. Then, the proof mass with precise position and size, as well as a cavity with uniform opening, may be simultaneously obtained in the subsequent process by easily removing the oxidation regions, thereby forming the MEMS device to gain improved functions and performances.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro-electromechanical system device comprising:
   a composite substrate comprising a first semiconductor layer, a bonding layer and a second semiconductor layer from bottom to top;
   a cavity disposed in the first semiconductor layer, the cavity being extended from the second semiconductor layer into the first semiconductor layer and not penetrated the first semiconductor layer;
   a piezoelectric stacking structure disposed on the composite substrate, the piezoelectric stacking structure comprising a suspended region over the cavity; and
   a proof mass disposed in the cavity and connected to the piezoelectric stacking structure, wherein a coverage area of the proof mass is 10% to 90% less than a coverage area of the suspended region,
   wherein the suspended region comprises a free end and an anchor end, and the proof mass is disposed adjacent to and laterally spaced apart from the free end of the suspended region and disposed away from the anchor end of the suspended region.

2. The micro-electromechanical system device according to claim 1, a material of the proof mass is the same as a material of the second semiconductor layer.

3. The micro-electromechanical system device according to claim 2, wherein a thickness of the proof mass is the same as a thickness of the second semiconductor layer.

4. The micro-electromechanical system device according to claim 1, further comprising an insulating layer disposed between the second semiconductor layer and the piezoelectric stacking structure.

5. The micro-electromechanical system device according to claim 4, wherein the piezoelectric stacking structure further comprises:
   a first metal layer disposed on the insulating layer, wherein the insulating layer comprises silicon oxide;
   a first piezoelectric layer disposed on the first metal layer; and
   a second metal layer disposed on the first piezoelectric layer.

6. The micro-electromechanical system device according to claim 1, further comprising a cover layer disposed on the piezoelectric stacking structure, wherein a vacuum cavity is disposed between the cover layer and the piezoelectric stacking structure.

7. The micro-electromechanical system device according to claim 6, wherein the cover layer is attached to the piezoelectric stacking structure through a protrusion structure.

8. The micro-electromechanical system device according to claim 1, wherein the piezoelectric stacking structure comprises a plurality of the suspended regions, and a plurality of the proof masses is disposed in the cavity to connect to each of the suspended regions respectively.

\* \* \* \* \*